US012802756B2

(12) United States Patent
Docquier et al.

(10) Patent No.: US 12,802,756 B2
(45) Date of Patent: Nov. 17, 2026

(54) METHOD FOR WRITING IN A PHASE CHANGE MEMORY

(71) Applicant: STMicroelectronics International N.V., Geneva (CH)

(72) Inventors: Guillaume Docquier, Waremme (BE); Michael Nicolaes, Forest (BE)

( * ) Notice: Subject to any disclaimer, the term of this patent is extended or adjusted under 35 U.S.C. 154(b) by 203 days.

(21) Appl. No.: 18/795,936

(22) Filed: Aug. 6, 2024

(65) Prior Publication Data

US 2025/0078925 A1 Mar. 6, 2025

(30) Foreign Application Priority Data

Aug. 31, 2023 (FR) ........................................ 2309151

(51) Int. Cl.
*G11C 13/00* (2006.01)

(52) U.S. Cl.
CPC ...... *G11C 13/0069* (2013.01); *G11C 13/0004* (2013.01)

(58) Field of Classification Search
CPC .................................................. G11C 13/0069
See application file for complete search history.

(56) References Cited

U.S. PATENT DOCUMENTS 10,162,540 B2 12/2018 Dawirs et al.
12,236,125 B2 * 2/2025 Roberts ............... G06F 11/3034
2012/0113710 A1 5/2012 Seo et al.
2014/0095956 A1 * 4/2014 Ozdemir ........... H03M 13/2778 714/755
2018/0059968 A1 3/2018 Jung
2018/0261285 A1 9/2018 Hattori et al.
2021/0074337 A1 3/2021 Suhler et al.
2022/0171542 A1 6/2022 Kim et al.

* cited by examiner

*Primary Examiner* — Hoai V Ho
(74) *Attorney, Agent, or Firm* — Slater Matsil, LLP

(57) ABSTRACT

The present description relates to a method of writing a first group of N data elements, N being an integer, into a second group of N memory cells of a phase-change memory, each data element of the first group comprising a metadata element, and at each writing of a data element of the first group into a memory cell of the second group, the value of the metadata element of the data element is modified.

20 Claims, 2 Drawing Sheets

METHOD FOR WRITING IN A PHASE CHANGE MEMORY

CROSS-REFERENCE TO RELATED APPLICATIONS

This application claims the priority benefit of French Application No. 2309151, filed on Aug. 31, 2023, entitled "Procédé d'écriture dans une mémoire à changement de phase," which is hereby incorporated herein by reference to the maximum extent allowable by law.

TECHNICAL FIELD

The present disclosure generally concerns electronic circuits and devices, and, in particular, memories. The present disclosure more precisely relates to phase-change memories, and to methods of data writing into phase-change memories.

BACKGROUND

Data storage is a major industrial challenge. There exist different types of technologies enabling to store data.

Phase-change memories are non-volatile memories which store data by modifying the state of a material contained in each memory element of the memory.

It would be desirable to be able to improve, at least partly, certain aspects of phase-change memories, and, in particular, certain aspects of methods of data writing into phase-change memories.

SUMMARY

There exists a need for higher-performance phase-change memories.

There exists a need for phase-change memories having a better endurance, that is, having a longer lifetime.

There exists a need for higher-performance methods of data writing into phase-change memories.

There exists a need for methods of data writing into phase-change memories having a better endurance.

An embodiment overcomes all or part of the disadvantages of known methods of data writing into phase-change memories.

An embodiment provides a method of writing a first group of N data, N being an integer, into a second group of N memory cells of a phase-change memory, wherein each data element of the first group comprises a metadata element, wherein for each writing of data element of the first group into a memory cell of the second group, the value of the metadata element of the data element is modified.

According to an embodiment, at the end of a write cycle, all the metadata of the N data have the same value.

According to an embodiment, the metadata element is a sequencing bit.

According to an embodiment, each memory cell of the second group comprises a plurality of memory elements adapted to each storing one data bit.

According to an embodiment, each data element of the first group is a data word comprising a plurality of data bits.

Another embodiment provides a device adapted to implementing the previously-described method, and comprising a phase-change memory.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for the understanding of the described embodiments have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "edge", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings.

Unless specified otherwise, the expressions "about", "approximately", "substantially", and "in the order of" signify plus or minus 10%, preferably of plus or minus 5%.

The embodiments described hereafter concern a method of writing a group of data into memory cells of a phase-change memory enabling to improve the endurance and, thus, the lifetime, of the phase-change memory. For this purpose, each data element of the data group comprises a metadata element having its value modified at each implementation of the write method.

The use of this metadata element, and, more particularly, the modification of its value at each writing, enables to avoid the use of a memory cell erasing step, that is, a step during which the memory cell has switched back to a state where all its bits are at a reference value, for example value "one". This enables to decrease the number of operations carried out during a cycle of writing into and/or of erasing of the memory, which enables to increase the memory lifetime.

Figure 1:
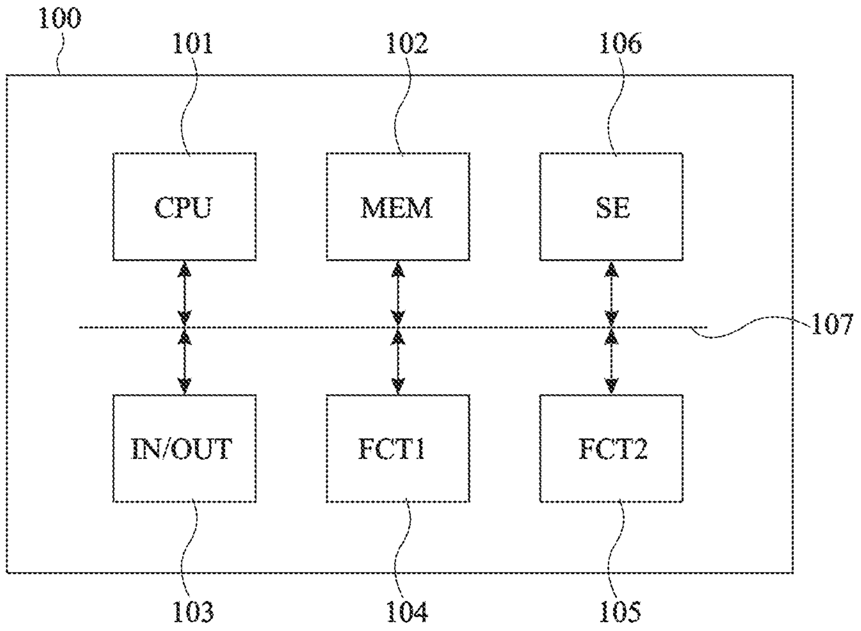
FIG. 1 very schematically shows in the form of blocks an embodiment of an electronic device adapted to implementing the implementation mode of the method of FIG. 3.
Figure 2:
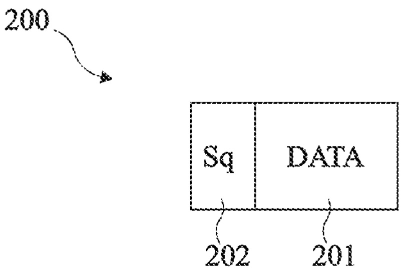
FIG. 2 shows, in the form of blocks, a data element to be written into a phase-change memory.
Figure 3:
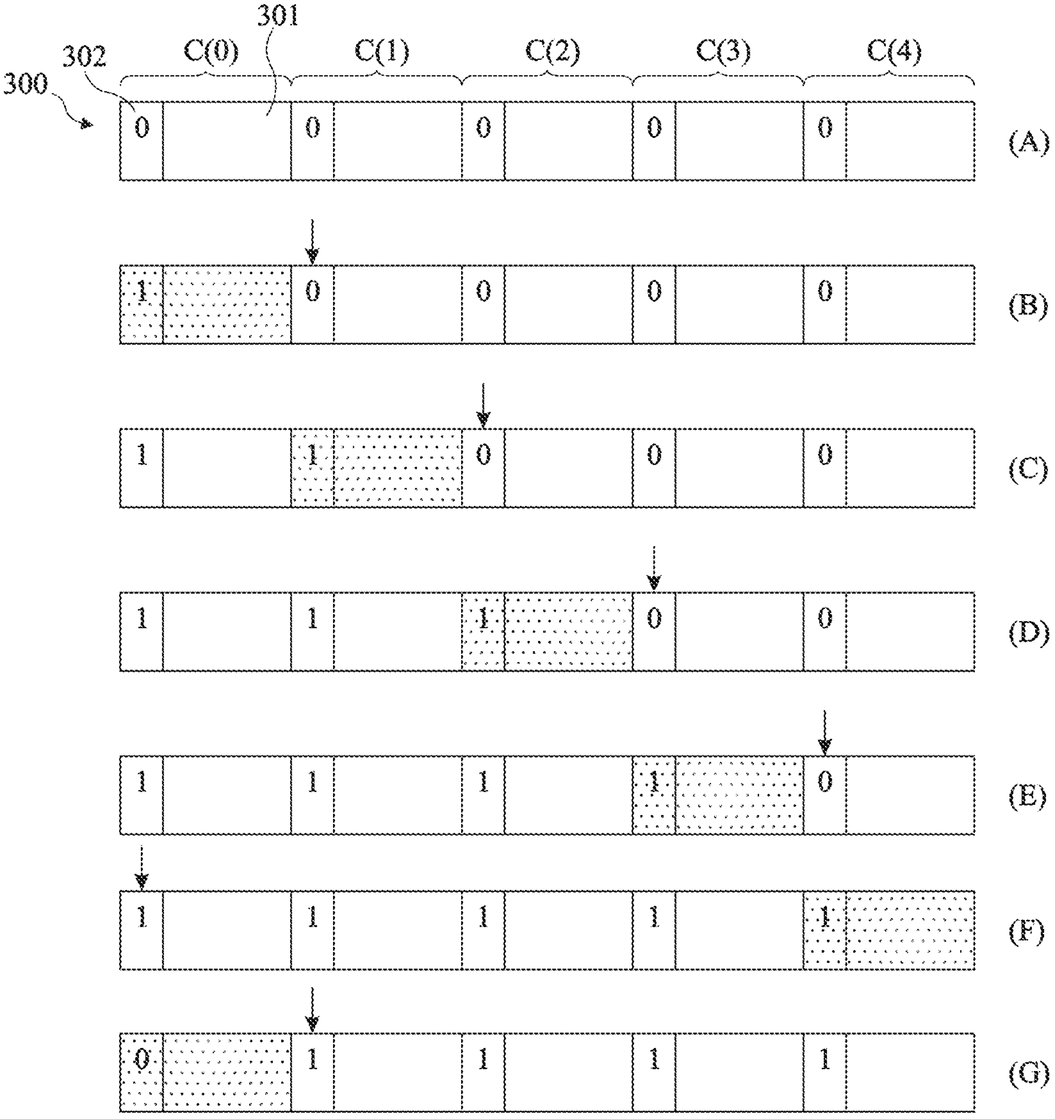
FIG. 3 shows, in the form of blocks, steps of an implementation mode of a method of data writing into a phase-change memory.

FIG. 1 is a block diagram very schematically showing an architecture of an example of an electronic device 100 adapted to implementing the embodiments described in relation with FIGS. 2 and 3.

Electronic device 100 may comprise a processor 101 (CPU) adapted to implementing different processings of data stored in memories and/or supplied by other circuits of device 100.

Electronic device 100 may further comprise one or a plurality of memories 102 (MEM), for example memories of different types, among which, for example, a non-volatile memory, a volatile memory, and/or a read-only memory.

According to an embodiment, electronic device 100 comprises a phase-change memory, or PCM memory. According to an embodiment, a phase-change memory is a non-volatile memory.

There is called in the rest of this description memory element of a phase-change memory a memory unit enabling to store binary information, that is, a data bit, that is, a "one" or a "zero".

There is called in the rest of this description memory cell of a phase-change memory an assembly of a plurality of memory elements enabling to store a plurality of data bits. According to an embodiment, each memory cell is adapted to storing a data element, or data word, formed of a plurality of data bits.

Electronic device 100 further comprises, for example, a secure element 106 (SE) adapted to processing critical and/or secret data. Secure element 106 may comprise its own processor(s), its own memory or memories, etc.

Electronic device 100 further comprises input/output circuits 103 (IN/OUT) adapted to enabling device 100 to communicate with one or a plurality of external electronic devices.

Electronic device 100 may further comprise different circuits 104 (FCT1) and 105 (FCT2) adapted to carrying out different functions. As an example, circuits 104 and 105 may comprise measurement circuits, data conversion circuits, circuits for controlling electronic or electromechanical equipment, etc.

Electronic device 100 further comprises one or a plurality of data buses 107 adapted to transferring data between its different components.

FIG. 2 very schematically shows in the form of blocks a data element 200 adapted to being written into a memory cell of a phase-change memory.

Data element 200 is a data word comprising a plurality of data bits as previously described.

According to an embodiment, data element 200 comprises bits 201 (DATA) storing a data word, and a metadata element 202 (Sq).

According to an embodiment, metadata element 202 is one or a plurality of bits, preferably one bit. According to a preferred embodiment, metadata element 202 is a sequencing bit. According to an example, metadata element 202 forms part of the most significant bits of data element 200. The use of metadata element 202 is described in relation with FIG. 3. The use of a sequencing bit, as opposed to the use of an erase bit that is updated with each erase operation, preserves memory life. Indeed, the modification of an erase bit would take place twice during a write operation, while the modification of the sequencing bit only takes place once.

FIG. 3 very schematically shows in the form of blocks the implementation of a method of writing a group of N data, N being an integer, of the type of the data element 200 described in relation with FIG. 2, into a group 300 of N memory cells of a phase-change memory.

There is considered a group 300 of memory cells C(i), i being an integer varying from 0 to N−1. In the example of FIG. 3, group 300 comprises five memory cells C(0) to C(4).

As previously described, each memory cell C(i) is adapted to storing a data element of the type of the data element 200 of FIG. 2. Thus, each memory cell C(i) stores a data word 301 and a metadata element 302. For this purpose, each memory cell C(i) comprises enough memory elements to store all the data bits forming a data element.

At an initial stage (A), all the memory cells of group 300 are ready to store data. According to an example, all the memory cells of group 300 are in a blank state, and all store a same data element, for example a reference data element such as a data element equal to a binary zero. According to another example, all the memory cells of group 300 already store data which have been written by using the method described herein.

According to an embodiment, in the initial state (A), all the memory cells of group 300 store data having their metadata having a same value. According to a preferred embodiment, the metadata element is a sequencing bit, and in the case shown in FIG. 1, the sequencing bit is at zero.

In a state (B), consecutive to the initial state (A), a write cycle starts by the writing of a first data element into a first memory cell of group 300, here memory cell C(0). A data element of the data group is written into the portion of the memory cell storing data word 301, and, according to an embodiment, the value of metadata element 302 is modified.

At a state (C), consecutive to state (B), the write cycle carries on with the writing of the second memory cell of group 300, here memory cell C(1). Thus, another data element of the data group is written into the portion of the memory cell storing the data word 301 of the data element, and the value of the metadata element 302 of the data element is modified.

Similarly, the write cycle continues with the writing of a data element into each memory cell of group 300, by modifying, for each memory cell, the value of the metadata element 302 of the data element. Thus, states (D), (E), and (F) show the writing of the other memory cells of group 300, and more particularly, the modification of the value of their metadata 302.

State (F) shows the final state of the write cycle. All the memory cells of group 300 have been written into, and all store a data element. All the metadata of memory cells C(i) have the same value, that is, here, value one.

At a state (G), consecutive to state (F), a new write cycle can start, and cell C(o) is the first one to be written.

An advantage of using metadata during a write cycle is that it enables to view which memory cell has been written into last. In particular, if a write cycle is interrupted, it is sufficient to find two consecutive memory cells which do not have the same metadata value to know when the cycle has been interrupted.

Another advantage of this embodiment is that it enables to implement data write cycles on memory portions, that is, a set number of memory cells. It may enable to implement a page writing system, such as used with flash-type non-volatile memories, or of eSTM type, that is, memories of Embedded Select in Trench Memory (eSTM) type.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

The invention claimed is:

1. A method of operating a phase-change memory, the method comprising:

writing a first group of N data elements, N being an integer, into a second group of N memory cells of the phase-change memory, each data element of the first group comprising a metadata element; and at each writing of a respective data element of the first group into a respective memory cell of the second group, modifying a value of the metadata element of the respective data element stored in the respective memory cell, the modifying comprising, after a first data element of the N data elements, toggling the metadata element of the respective data element, without changing the other metadata elements, to be equal to the metadata element of an immediately-prior data element.

2. The method according to claim 1, wherein at an end of a write cycle of the N data elements, all of the metadata elements of the N data elements stored in the N memory cells have a same value.

3. The method according to claim 1, wherein the metadata element is a sequencing bit.

4. The method according to claim 1, wherein each memory cell of the second group comprises a plurality of memory elements, each configured to store one data bit.

5. The method according to claim 1, wherein each data element of the first group further is a data word comprising a plurality of data bits.

6. The method according to claim 1, further comprising individually writing the first group of N data elements into the second group of N memory cells in consecutive order.

7. The method according to claim 1, wherein each memory cell of the second group comprises a metadata bit and a plurality of data bits.

8. An electronic device comprising:

a data bus;

a phase-change memory coupled to the data bus, wherein the phase-change memory comprises a second group of N memory cells, wherein N is an integer; and a processor operatively coupled to the phase-change memory via the data bus, wherein the processor is configured to:

write a first group of N data elements into the second group of N memory cells of the phase-change memory, wherein each data element of the first group comprises a metadata element; and at each writing of a respective data element of the first group into a respective memory cell of the second group, modify a value of the metadata element of the respective data element stored in the respective memory cell, the modify comprising, after a first data element of the N data elements, toggle the metadata element of the respective data element, without changing the other metadata elements, to be equal to the metadata element of an immediately-prior data element.

9. The electronic device according to claim 8, wherein at an end of a write cycle of the N data elements, all of the metadata elements of the N data elements stored in the N memory cells have a same value.

10. The electronic device according to claim 8, wherein the metadata element is a sequencing bit.

11. The electronic device according to claim 8, wherein each memory cell of the second group comprises a plurality of memory elements, each configured to store one data bit.

12. The electronic device according to claim 8, wherein the processor is further configured to individually write the first group of N data elements into the second group of N memory cells in consecutive order.

13. The electronic device according to claim 8, wherein each memory cell of the second group comprises a metadata bit and a plurality of data bits.

14. A method of operating a phase-change memory, the method comprising:

writing a first group of N data words, N being an integer, into a second group of N memory cells of the phase-change memory, each memory cell of the second group comprising a metadata element; and at each writing of a respective data word of the first group into a respective memory cell of the second group, modifying a value of the metadata element of the respective memory cell, the modifying comprising, after a first data word of the N data words, toggling the metadata element of the respective memory cell, without changing the other metadata elements, to be equal to the metadata element of an immediately-prior memory cell.

15. The method according to claim 14, wherein at an end of a write cycle of the N data words, all of the metadata elements of the N memory cells have a same value.

16. The method according to claim 14, wherein the metadata element is a sequencing bit.

17. The method according to claim 14, wherein each memory cell of the second group comprises a plurality of memory elements, each configured to store one data bit.

18. The method according to claim 14, wherein each data word of the first group comprises a plurality of data bits.

19. The method according to claim 14, further comprising individually writing the first group of N data words into the second group of N memory cells in consecutive order.

20. The method according to claim 14, wherein each memory cell of the second group comprises a metadata bit and a plurality of data bits.

* * * * *